United States Patent [19]
Eberhardt et al.

[11] Patent Number: 6,091,332
[45] Date of Patent: Jul. 18, 2000

[54] RADIO FREQUENCY IDENTIFICATION TAG HAVING PRINTED CIRCUIT INTERCONNECTIONS

[75] Inventors: Noel H. Eberhardt, Cupertino; Philip R. Wright, San Jose, both of Calif.

[73] Assignee: Motorola, Inc., Schaumburg, Ill.

[21] Appl. No.: 09/115,279

[22] Filed: Jul. 14, 1998

Related U.S. Application Data

[63] Continuation-in-part of application No. 09/094,261, Jun. 9, 1998, and a continuation-in-part of application No. 09/103,226, Jun. 23, 1998.

[51] Int. Cl.[7] .................................................. G08B 13/14
[52] U.S. Cl. ................................. 340/572.1; 340/572.7; 361/772; 428/901
[58] Field of Search ............................. 340/572.1, 572.7; 29/840; 428/901, 209; 228/180.22; 361/748, 749, 751, 772, 774; 257/692, 666, 735, 773

[56] References Cited

U.S. PATENT DOCUMENTS

| | | |
|---|---|---|
| 3,934,336 | 1/1976 | Morse ........................................ 29/827 |
| 4,759,970 | 7/1988 | Seeger, Jr. et al. ...................... 428/209 |
| 5,528,222 | 6/1996 | Moskowitz et al. ..................... 340/572 |
| 5,566,441 | 10/1996 | Marsh et al. ............................... 29/600 |
| 5,768,109 | 6/1998 | Gulick et al. ......................... 361/772 X |

*Primary Examiner*—Thomas Mullen
*Attorney, Agent, or Firm*—Val Jean F. Hillman

[57] ABSTRACT

A radio frequency identification tag (100) includes a radio frequency identification tag circuit chip (112) bonded to a substrate (114). Additional circuit components (140) are also bonded to the substrate. The substrate is formed to include a number of conductive traces (18, 20), and the radio frequency identification tag and circuit components are electrically coupled to the traces via selective application of a printable conductive medium (130, 132).

34 Claims, 5 Drawing Sheets

RADIO FREQUENCY IDENTIFICATION TAG HAVING PRINTED CIRCUIT INTERCONNECTIONS

CROSS-REFERENCE TO RELATED APPLICATIONS

The present application is a continuation-in-part of the following commonly-assigned prior U.S. patent applications: Noel H. Eberhardt et al., "Radio frequency identification tag having an article integrated antenna," application Ser. No. 09/094,261, filed Jun. 9, 1998, attorney docket number IND10149; and Noel H. Eberhardt, "Radio frequency identification tag having a printed antenna and method," application Ser. No. 09/103,226, filed Jun. 23, 1998, attorney docket number IND10148, the disclosures of which prior applications are hereby expressly incorporated herein by reference, verbatim and with the same effect as though such disclosures were fully and completely set forth herein.

FIELD OF THE INVENTION

The present application relates to radio frequency identification tags including, but not limited to, radio frequency identification tags having printed circuit interconnections.

BACKGROUND OF THE INVENTION

Radio frequency identification tags and radio frequency identification tag systems are known, and find numerous uses. For example, radio frequency identification tags are frequently used for personal identification in automated gate sentry applications protecting secured buildings or areas. Information stored on the radio frequency identification tag identifies the person seeking access to the secured building. A radio frequency identification tag system conveniently provides for reading the information from the radio frequency identification tag at a small distance using radio frequency (RF) data transmission technology. Most typically, the user simply holds or places the radio frequency identification tag near a base station that transmits an excitation signal to the radio frequency identification tag powering circuitry contained on the radio frequency identification tag. The circuitry, responsive to the excitation signal, communicates the stored information from the radio frequency identification tag to the base station, which receives and decodes the information. In general, radio frequency identification tags are capable of retaining and, in operation, transmitting a substantial amount of information—sufficient information to uniquely identify individuals, packages, inventory and the like.

The radio frequency identification tag is also capable of receiving and storing information. In a read/write application, the base station is not only capable of sending an excitation signal and receiving a response from the radio frequency identification tag, but it is also capable of sending a data, or write, signal to the radio frequency identification tag. The radio frequency identification tag receives the write signal, which may contain data to be stored within the tag, a code or a command. Depending on the type of write signal, the radio frequency identification tag responds accordingly, such as by storing the data or acting upon the command.

A typical technology for powering and reading a radio frequency identification tag is inductive coupling or a combination of inductive power coupling and capacitive data coupling. Inductive coupling utilizes a coil element in the radio frequency identification tag. The coil element is excited (or "energized") by an excitation signal from the base station to provide power to the radio frequency identification tag circuitry. The radio frequency identification tag coil, or a second tag coil, may be used to transmit and receive the stored information between the radio frequency identification tag and the base station. Radio frequency identification tags relying on inductive coupling are sensitive to orientation of the radio frequency identification tag with respect to the base station since the field created by the excitation signal must intersect the coil element at substantially a right angle for effective coupling. Read ranges for inductively coupled devices are generally on the order of several centimeters. Longer read distances are desirable, and for certain applications, such as electronic animal identification, baggage tracking, parcel tracking and inventory management applications, are necessary.

Another technology for powering and reading radio frequency identification tags is electrostatic coupling such as employed in the radio frequency identification tag systems and radio frequency identification tags disclosed in the above referenced applications. These systems advantageously provide for substantially increased read/write distances over those available in the prior art. Another advantage derived from the use of the systems and tags therein disclosed is that the user need not bring the radio frequency identification tag in close proximity to a base station or to substantially orient the tag with respect to the base station. It is therefore possible to incorporate the antenna elements of the base station into, for example, a doorway or a vestibule, a package conveyer or an article sorting system, and to energize the tag and read the tag information at a greater distance.

To couple either the inductive or electrostatic signals between the base station and the radio frequency identification tag, the tag necessarily includes an antenna having at least one and frequently two antenna elements. Typically, a tag circuit chip and the antenna are electrically coupled and bonded to a tag substrate. The tag may also include additional components, for example, resistors, capacitors, inductors, etc. that must also be electrically coupled to the tag circuit chip and/or the antenna. Conventional tag design provides conductive traces formed on a substrate with the tag circuit chip, components and antenna bonded to the substrate and electrically coupled to the conductive traces. Wire bonding is a common technique for providing an electrical couple between the conductive pads on the tag circuit chip and/or the component and the conductive traces. Alternatively, "flip" chip technology provides raised conductive regions ("bumped pads") on the tag circuit chip (and similarly on the electrical components). The "flip" chip, during assembly, is inverted and positioned to the substrate with the bumped pads aligning with and electrically coupling to the conductive traces. A conductive adhesive may be used between the bumped pads and the conductive traces to ensure a good electrical couple as well as to supplement the mechanical adhesion of the tag circuit chip to the substrate.

Size, and particularly thickness, of the radio frequency identification tag is important, and it is desirable to maintain overall thickness at less than 0.5 millimeter (mm). To provide thinner tags, it is proposed to form the conductive traces by printing conductive ink onto the substrate, which is typically paper or synthetic paper. This all but eliminates wire bonding as a joining technology as it generally requires a relatively rigid substrate and is thus not well suited for coupling to traces printed on a paper substrate. Wire bonding also unacceptably adds to the tag thickness. For example, a typical wire bond may add as much as 0.07–0.18 mm to the tag thickness in wire bond loop height.

Flip chip technology is more suited for coupling to printed traces, but it too increases the thickness of the tag, i.e., the bumped pads provide a thicker overall profile for the tag circuit chip. Flip chip technology adds cost to the tag circuit chip in the forming of the bumped pads and requires the use of a backfill adhesive for good mechanical adhesion to the substrate. Flip chip technology also requires high cost production equipment to pick, invert and place the tag circuit chip to the substrate. Namely, the tag circuit chip must be first inverted from the fabrication wafer and then precision aligned to make the blind attachment to the substrate. Use of an anisotropic adhesive alleviates some of the alignment difficulties and eliminates the need for backfill adhesive, but at substantially increased cost over isotropic adhesives.

Thus, there is a need for an improved radio frequency identification tag.

DETAILED DESCRIPTION OF THE PREFERRED EMBODIMENTS

In accordance with preferred embodiments of the present invention, a circuit assembly includes a circuit chip secured to a substrate formed with a plurality of conductive traces. The circuit assembly may also include additional circuit chips and components. The circuit chips and components are interconnected via the conductive traces and selective application of a printable conductive medium. In a particularly preferred embodiment of the present invention, a radio frequency identification tag includes at least a radio frequency identification tag circuit chip and an antenna secured to a substrate formed with a number of conductive traces. The radio frequency identification tag circuit chip and the antenna are electrically coupled via the conductive traces and selective application of a printable conductive medium.

Figure 1:
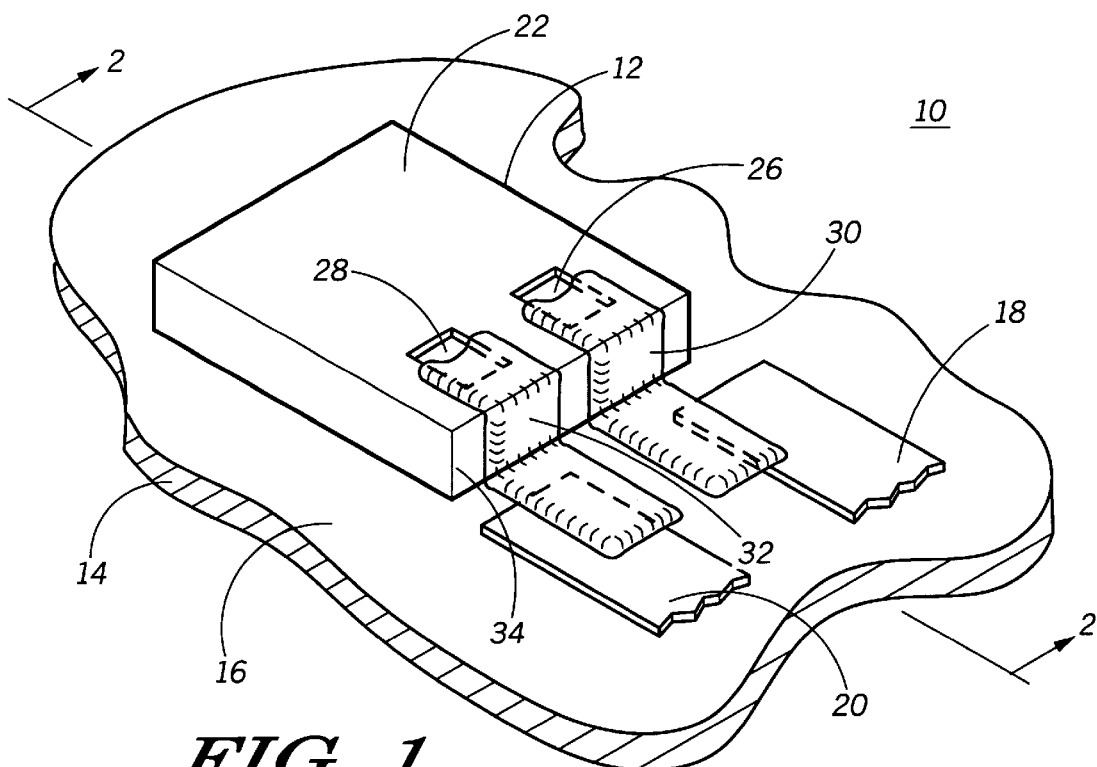
FIG. 1 is a perspective view of a circuit assembly in accordance with a preferred embodiment of the present invention.
Figure 2:
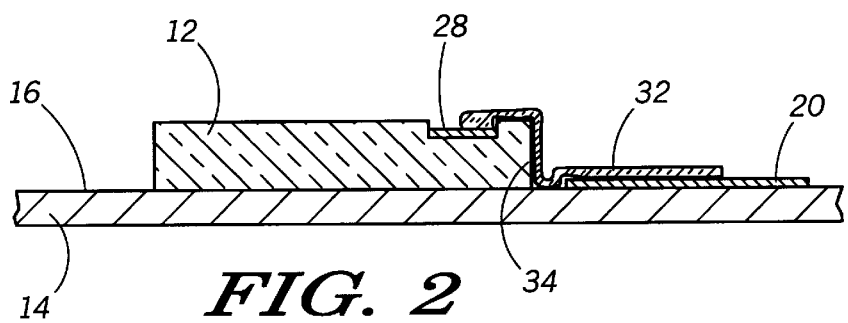
FIG. 2 is a cross-section view along line 2—2 of FIG. 1.

In accordance with a preferred embodiment of the present invention and referring to FIG. 1 and FIG. 2, a circuit assembly 10 includes a circuit chip 12 secured to a substrate 14. Preferred materials for substrate 14 include paper, synthetic paper, cardboard, plastic and the like. Most preferably substrate 14 is a high-temperature tolerant tape, such as Kapton tape, capable of withstanding elevated curing temperatures used during manufacture as well as operating temperatures of circuit assembly 10. Formed on a surface 16 of substrate 14 are a plurality of conductive traces shown generally as a conductive trace 18 and a conductive trace 20. Conductive trace 18 and conductive trace 20 are preferably formed by printing using a conductive medium such as conductive ink the desired pattern of traces on surface 16.

Circuit chip 12 is preferably bonded or otherwise secured to surface 16. Circuit chip 12 may be of virtually any type of integrated circuit chip construction and further includes formed on, and possibly recessed into, an upper surface 22 a first conductive pad 26 and a second conductive pad 28. It will be appreciated that circuit chip 12 may be formed to include additional conductive pads, as the application requires and/or its physical size permits. Electrically coupling conductive pad 26 to conductive trace 18 is a layer 30 of a conductive medium, and electrically coupling conductive pad 28 to conductive trace 20 is a layer 32 of a conductive medium. As seen in FIG. 1 and FIG. 2, layer 32 is substantially uniform in thickness and extends continuously from conductive pad 28 along an edge 34 of circuit chip 12 to conductive trace 20. Layer 30 similarly extends from conductive pad 26 to conductive trace 18.

A suitable conductive medium for forming layer 30 and layer 32 is conductive ink, such as a carbon/graphite bearing ink or a metal, either precious or non-precious, bearing ink. The conductive medium is preferably applied using a printing technique, such as and without limitation, jet printing, screen printing, and pad transfer printing. Alternative conductive mediums include conductive adhesive (isotropic or anisotropic), conductive polymers and the like. As is appreciated from FIG. 2, the thickness of circuit assembly 10 is not substantially greater than the thickness of substrate 14 and the thickness of circuit chip 12. In this regard, circuit assembly 10 may be constructed to a thickness substantially less than that possible using either bumped pad circuit chips or wire bonding. Moreover, the conductive medium, such as carbon/graphite bearing ink, is inexpensive and provides a substantial cost advantage in comparison to forming bumped pads, making wire bond connections and/or using anisotropic adhesives. Thus, circuit assembly 10 is well adapted for, among other applications, constructing radio frequency identification tags.

Figure 3:
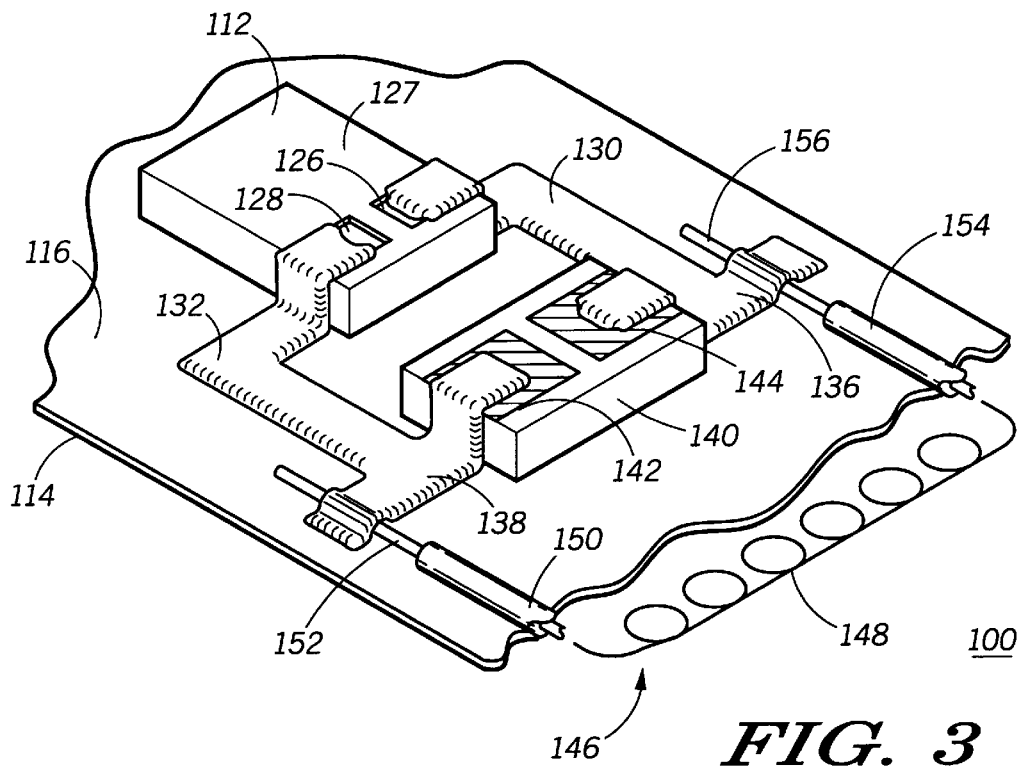
FIG. 3 is a perspective view of a radio frequency identification tag in accordance with a preferred embodiment of the present invention.

Referring now to FIG. 3, a radio frequency identification tag 100 includes a radio frequency identification tag circuit chip ("circuit chip") 112 secured to substrate 114. Circuit chip 112 includes a first conductive pad 126 and a second conductive pad 128 formed in an upper surface 127. Radio frequency identification tag 100 is arranged as an inductive coupled device and thus includes a coil antenna 148 formed from insulated magnetic wire and including a first antenna lead 150 and a second antenna lead 154. Each of first antenna lead 150 and second antenna lead 154 is formed to include a stripped portion 152 and a second stripped portion 156, respectively. It will be appreciated that radio frequency identification tag 100 is shown and described in an exemplary embodiment of the present invention as an inductive coupling type radio frequency identification tag. Other types of radio frequency identification tags including, without limitation, capacitive coupled, magnetic coupled and combinations thereof may be constructed without departing from the fair scope of the present invention. Radio frequency identification tag 100 also includes a circuit component 140, such as a resonating capacitor, including a first circuit component conductive pad 142 and a second circuit component conductive pad 144. Each of circuit chip 112, circuit component 140 and antenna 148 are preferably bonded to a surface 1 16 of substrate 114.

In accordance with the present invention, each of circuit chip 112, circuit component 140 and antenna 148 are operatively, electrically coupled by a layer 130 and a layer 132 of conductive medium. A suitable conductive medium is preferably a conductive ink, conductive polymer, conductive adhesive (isotropic or anisotropic) or the like printed onto surface 116. More particularly, layer 130 is formed to include a coupling portion 136. Layer 130 electrically couples to conductive pad 126 and extends along surface 116 to coupling portion 136. Coupling portion 136 is formed to electrically couple conductive pad 144 and stripped portion 156. In this manner, layer 130 interconnects each of conductive pad 126, conductive pad 144 and stripped portion 156. Similarly, layer 132 is formed to include a coupling portion 138, and is arranged to operatively, electrically couple conductive pad 128, conductive pad 142 and stripped portion 152.

In accordance with preferred embodiments of the present invention, each of circuit chip 112, circuit component 140 and antenna 148 are bonded or otherwise secured to surface 116. Next, each of layer 130 and layer 132 is applied, preferably using a printing technique, to electrically and operably couple the components. Layer 130 and layer 132 do not add substantially to the thickness of radio frequency identification tag 100. Thus, a thickness of radio frequency identification tag 100 is not substantially greater than a thickness of substrate 114 and the thickest of circuit chip 112, circuit component 140 and antenna 148.

Figure 5:
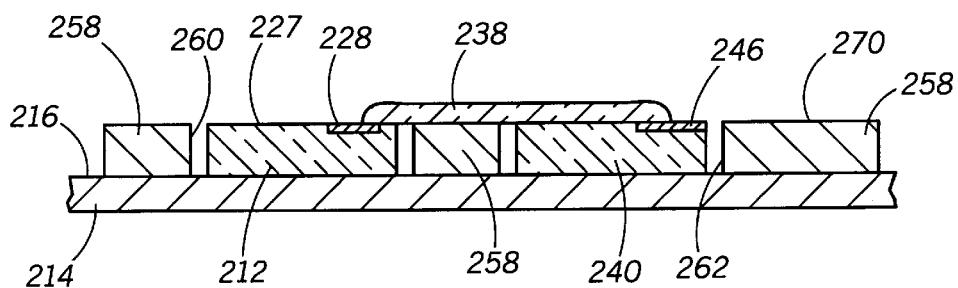
FIG. 5 is a cross-section view along line 5—5 of FIG. 4.
Figure 4:
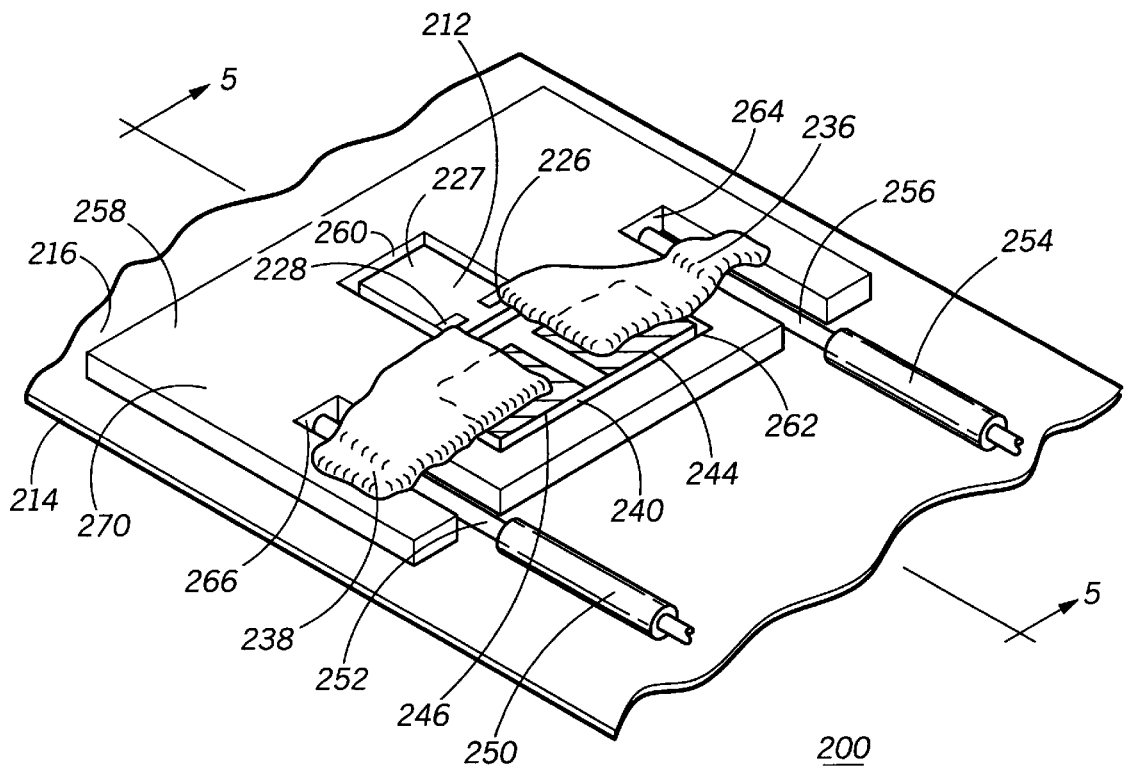
FIG. 4 is a perspective view of a radio frequency identification tag in accordance with an alternative preferred embodiment of the present invention.

Referring now to FIG. 4 and FIG. 5, a radio frequency identification tag 200 in accordance with an alternate preferred embodiment of the present invention is shown. Radio frequency identification tag 200 includes a circuit chip 212 having a first conductive pad 226 and a second conductive pad 228 formed in an upper surface 227. Radio frequency identification tag also includes an antenna (not shown) including a first lead 250 and a second lead 254 formed, respectively, to include a stripped portion 252 and a stripped portion 256. A circuit component 240 formed to include a first circuit component conductive pad 244 and a second circuit component conductive pad 246 is also included.

A template 258 is also provided bonded to a surface 216 of substrate 214. Template 258 is formed to include a circuit chip recess 260, a circuit component recess 262, a first antenna lead recess 264 and a second antenna lead recess 266. It will be appreciated that a separate template element need not be provided, and instead, substrate 214 may be formed with recessed regions corresponding respectively to each of the above-described recesses 260–266. In accordance with preferred embodiments of the present invention circuit chip 212 is disposed within circuit chip recess 260 and is bonded to surface 216. Likewise, circuit component 240 is disposed within circuit component recess 262, stripped portion 252 is disposed within recess 266 and stripped portion 256 is disposed within recess 264 with each of the respective elements being secured, preferably bonded, to surface 216. Each of recess 260, recess 262, recess 264 and recess 266 are formed to allow the respective elements to be positioned below an upper surface 270 of template 258. In this manner the elements are protected from detachment during use of radio frequency identification tag 200.

Further in accordance with preferred embodiments of the present invention, a first layer 236 and a second layer 238 of conductive medium are provided to operatively, electrically couple circuit chip 212, circuit component 240, stripped portion 252 and stripped portion 256. A suitable conductive medium is preferably a conductive ink, a conductive polymer or a conductive adhesive (isotropic or anisotropic). Layer 236 and layer 238 is preferably printed using a suitable printing technique to surface 270. More particularly, layer 236 is arranged to couple conductive pad 226, conductive pad 244 and stripped portion 256. Similarly, layer 238 is arranged to couple conductive pad 228, conductive pad 246 and stripped portion 252.

As best seen in FIG. 5, layer 236 and layer 238 do not add substantially to the overall thickness radio frequency identification tag 200. The overall thickness of radio frequency identification tag 200 is thus approximately the thickness of substrate 214 and template 258. Moreover, circuit chip 212, circuit component 240, stripped portion 252 and stripped portion 256 are protected in operation by template 258.

Figure 6:
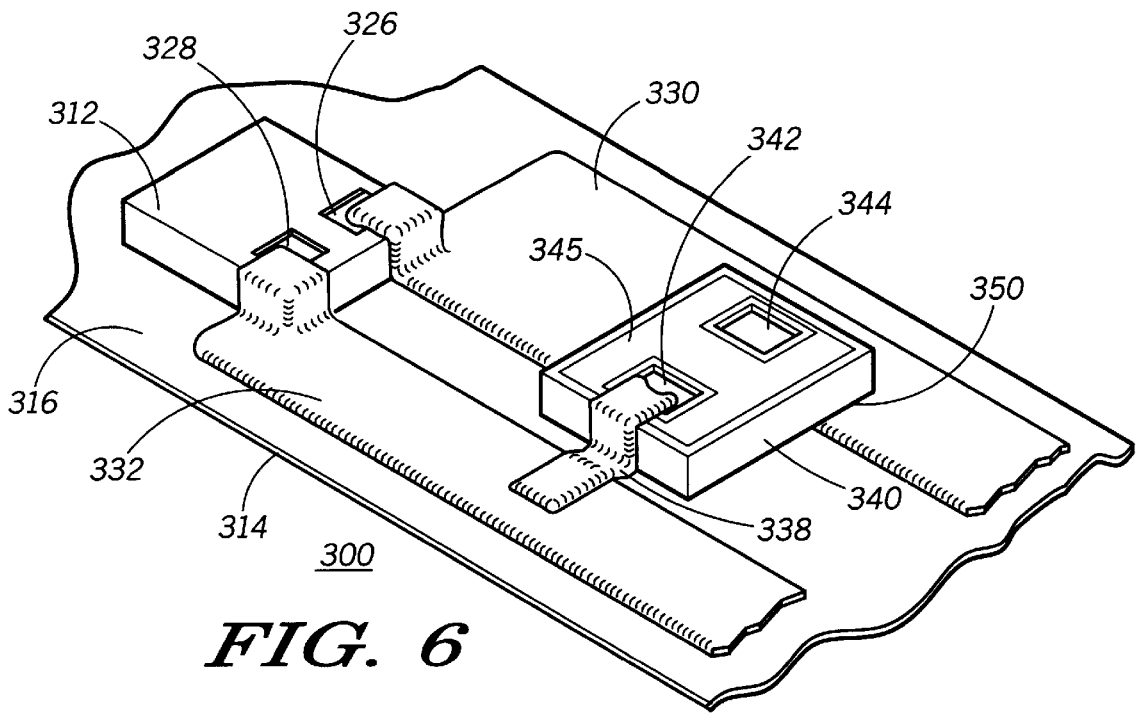
FIG. 6 is a perspective view of a circuit assembly in accordance with an alternate preferred embodiment of the present invention.

Referring now to FIG. 6, a circuit assembly 300 in accordance with an alternate preferred embodiment of the present invention includes a first circuit chip 312 and a second circuit chip 340 secured to a surface 316 of a substrate 314. First circuit chip 312 includes a first conductive pad 326 and a second conductive pad 328. Second circuit chip 340 includes a first conductive pad 342 formed in an upper surface 345. Second circuit chip 340 may include a second conductive pad 344 formed in upper surface 345 or a conductive pad (not shown) formed in a wall portion or on a bottom portion of second circuit chip 340. In accordance with preferred embodiments of the present invention a first layer 330 and a second layer 332 are provided to operatively, electrically couple first circuit chip 312 and second circuit chip 340. A suitable conductive medium is a conductive ink, a conductive polymer, a conductive adhesive (isotropic or anisotropic), or the like, applied using a printing technique. Layer 330 is applied to couple first conductive pad 326 to second circuit chip 340. More particularly, layer 330 includes a coupling region 350 disposed around and below second circuit chip 340 and electrically coupling to the second conductive pad. Layer 332 is electrically coupled to second conductive pad 328 and extends longitudinally along surface 316. A coupling region 338 is provided, consisting of a conductive medium also printed on surface 316, and couples layer 332 to first conductive pad 342.

The arrangement of circuit assembly 300 provides for a simplified manufacturing process. In a preferred process, first circuit chip 312 is secured to surface 316, preferably using pick-and-place automation. Next, layer 330 and layer 332 are printed onto surface 316. Second circuit chip 340 is then secured to surface 316 also using pick-and-place automation. Second circuit chip 340 is positioned into layer 330 forming coupling region 350 coupling to the second conductive pad. Finally, coupling region 338 is formed, again by printing, coupling layer 330 to first conductive pad 342. Thus, circuit assembly 300 is well adapted for, among other applications, constructing radio frequency identification tags.

Figure 7:
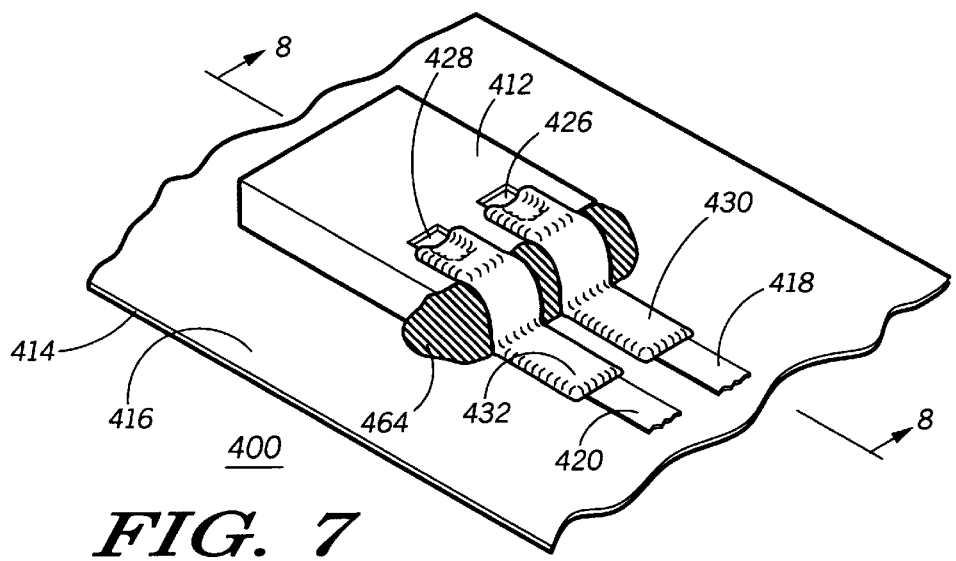
FIG. 7 is a perspective view of a circuit assembly in accordance with an alternate preferred embodiment of the present invention.
Figure 8:
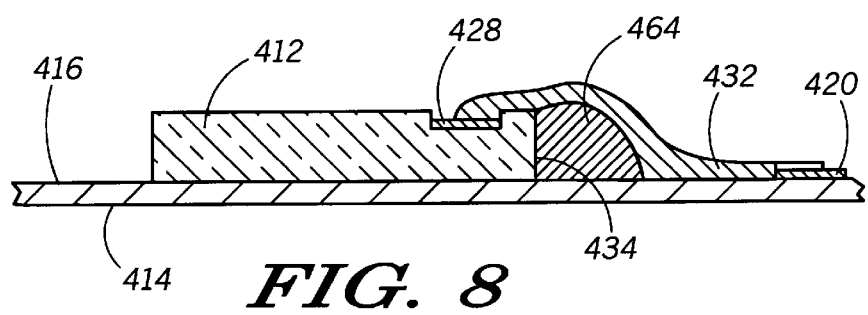
FIG. 8 is a cross-section view along line 8—8 of FIG. 7.

Referring now to FIG. 7 and FIG. 8, a circuit chip assembly 400 includes a circuit chip 412 secured to a surface 416 of a substrate 414. Substrate 414 is also formed to include a plurality of conductive traces, generally indicated by conductive trace 418 and conductive trace 420. In certain applications it may be required to insulate an edge 434 of circuit chip 412. In such applications, following bonding of circuit chip 412 to surface 416 a layer of insulating material 464 is applied along edge 434. A first layer 430 and a second layer 432 of conductive medium are provided for operatively, electrically coupling circuit chip 412 to conductive trace 418 and conductive trace 420. A suitable conductive medium is a conductive ink, a conductive polymer, a conductive adhesive (isotropic or anisotropic) or the like applied using a printing technique.

Figure 9:
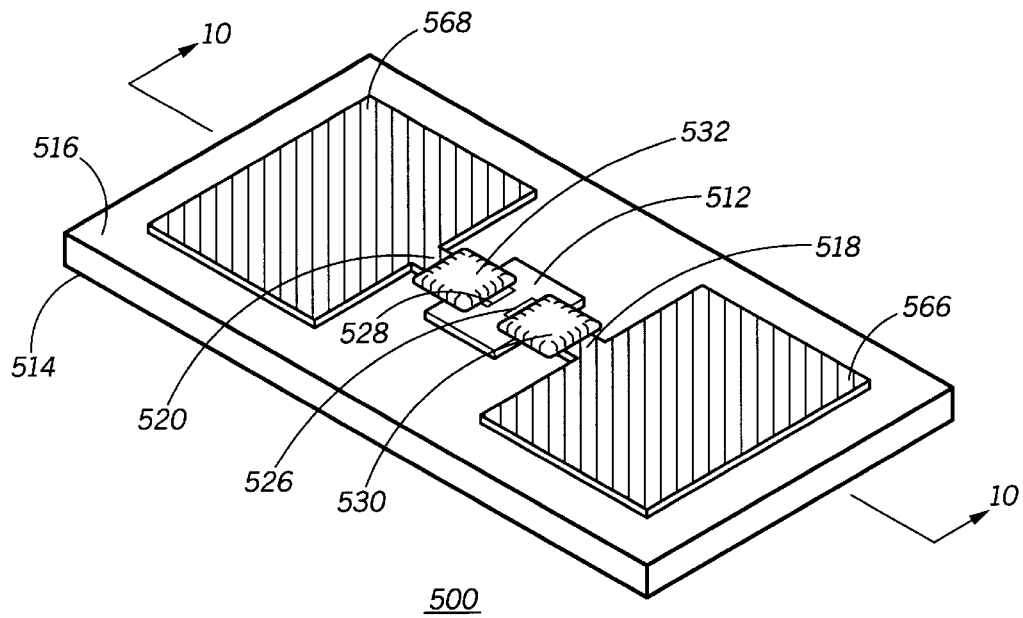
FIG. 9 is a perspective view of a radio frequency identification tag in accordance with an alternate preferred embodiment of the present invention.
Figure 10:
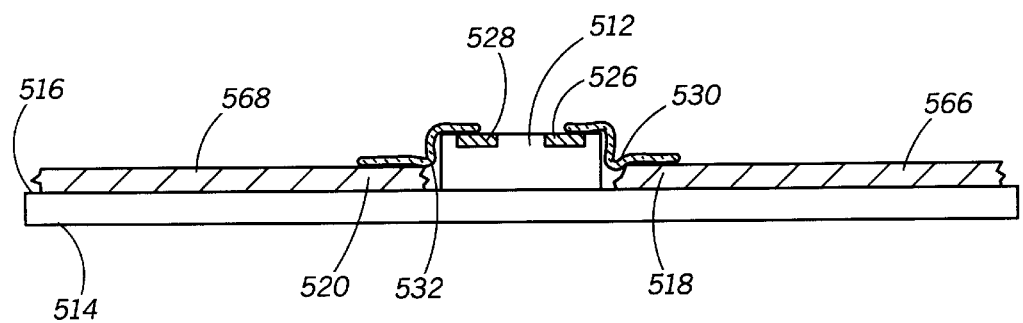
FIG. 10 is a cross-section view along line 10—10 of FIG. 9.

Referring now to FIG. 9 and FIG. 10, a radio frequency identification tag 500 in accordance with a preferred embodiment of the present invention includes a radio frequency identification tag circuit chip ("circuit chip") 512 secured to a surface 516 of a substrate 514. Radio frequency identification tag 500 is arranged to operate as a capacitive coupled device, and as such substrate 514 is formed to include a first antenna element 566 and a second antenna element 568. Each of first antenna element 566 and second antenna element 568 is preferably formed by printing a conductive pattern on surface 516 using a conductive ink or other suitable conductive medium. First antenna element 566 is coupled to a conductive trace 518 and second antenna element 568 is coupled to a conductive trace 520. Each of conductive trace 518 and conductive trace 520 is also formed by printing, preferably at the same time as printing first antenna element 566 and second antenna element 568, using a conductive ink or other suitable conductive medium. Circuit chip 512 includes a first conductive pad 526 and a second conductive pad 528, and circuit chip 512 is secured to surface 516. A first layer 530 and a second layer 532 of a conductive medium are provided and operatively, electrically couple circuit chip 512 to conductive trace 518 and conductive trace 520.

More particularly, a suitable conductive medium is a conductive ink, a conductive polymer, a conductive adhesive (isotropic or anisotropic) or the like preferably applied using a printing technique. Layer 530 is applied to couple first conductive pad 526 to conductive trace 518, and layer 532 is applied to couple second conductive pad 528 to second conductive trace 520. As best seen in FIG. 10, layer 530 and layer 532 do not add substantially to the thickness of radio frequency identification tag 500. Thus, a thickness of radio frequency identification tag 500 is not substantially greater than a thickness of substrate 514 and the thickness of circuit chip 512. Moreover, radio frequency identification tag 500 is efficiently and cost effectively manufactured.

Figure 11:
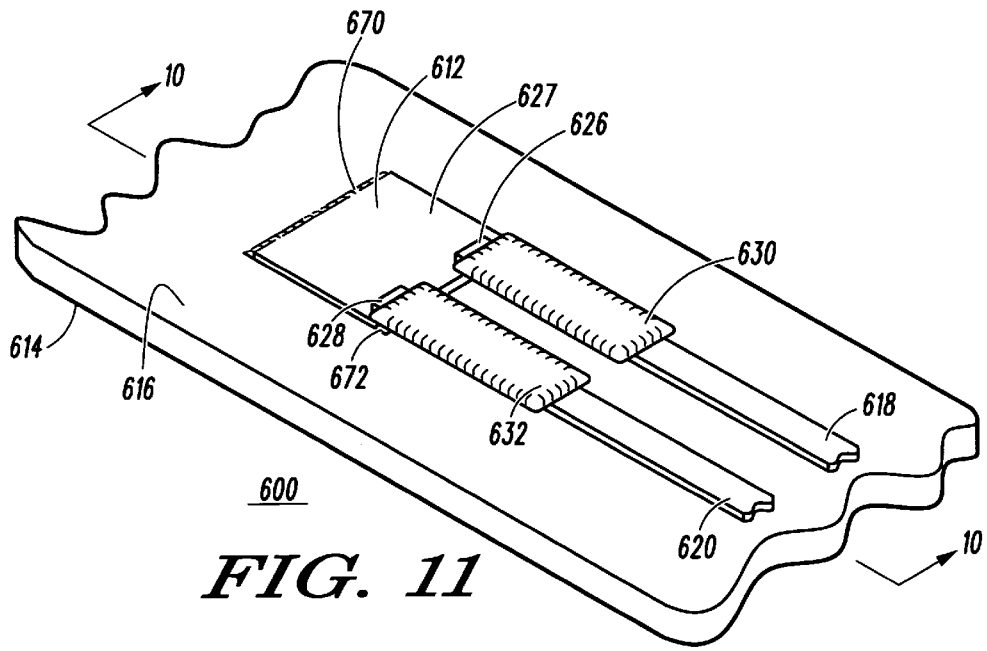
FIG. 11 is a perspective view of a circuit assembly in accordance with an alternate preferred embodiment of the present invention.
Figure 12:
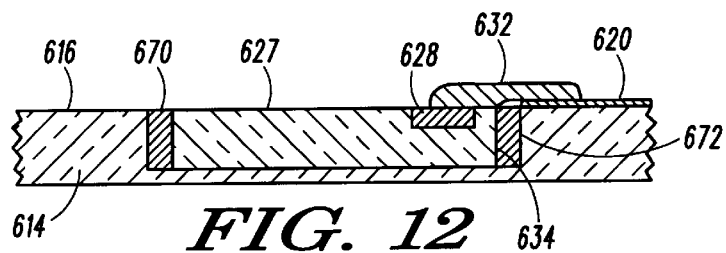
FIG. 12 is a cross-section view along line 10—10 of FIG. 11.

Referring now to FIG. 11 and FIG. 12, a circuit assembly 600 in accordance with a preferred embodiment of the present invention includes a circuit chip 612 disposed within a recess 670 formed in a surface 616 of substrate 614. Substrate 614 is further formed to include a plurality of conductive traces generally indicated as conductive trace 618 and conductive trace 620. Conductive trace 618 and conductive trace 620 are arranged to interconnect with virtually any number of additional circuit elements (not shown) associated with circuit assembly 600.

Circuit chip 612 includes a first conductive pad 626 and a second conductive pad 628 formed in an upper surface 627. Circuit chip 612 is operatively, electrically coupled to conductive trace 618 and conductive trace 620 by a layer 630 and a layer 632, respectively, of a conductive medium. A suitable conductive medium is a conductive ink, a conductive polymer, a conductive adhesive (isotropic or anisotropic) or the like. More particularly, layer 630 couples conductive pad 626 to conductive trace 618, and layer 632 couples conductive pad 628 to conductive trace 620.

As best seen in FIG. 12, circuit chip 612 is disposed within recess 670 such that upper surface 627 is at or below surface 616. Layer 630 and layer 632 do not add substantially to the thickness of circuit assembly 600. Thus the overall thickness of circuit assembly 600 is not substantially greater than the thickness of substrate 614, which is not substantially greater than the thickness of circuit chip 612. In certain applications it may be necessary to insulate a side wall portion 634 of circuit chip 612. An insulating material 672 may be disposed within recess 670 and around circuit chip 612. Therefore, circuit assembly 600 is well adapted for, among other applications, constructing radio frequency identification tags.

Figure 13:
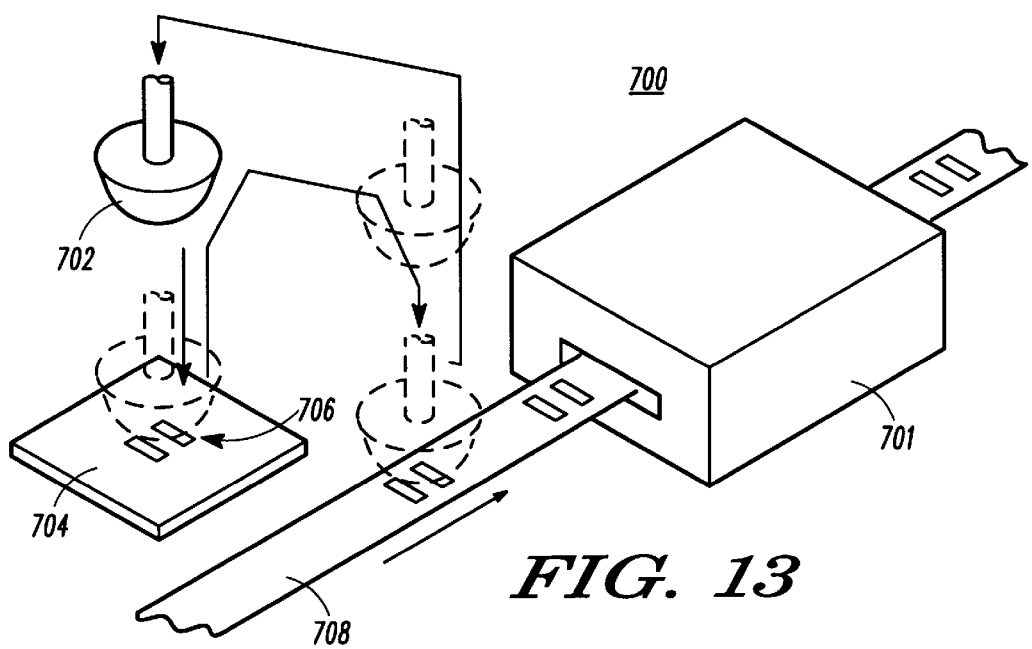
FIG. 13 is a schematic illustration of an apparatus for printing interconnections in accordance with a preferred embodiment of the present invention.

With reference to FIG. 13 an apparatus 700 for pad printing conductive medium is shown. Apparatus 700 includes a resilient printing pad 702 secured to an articulating apparatus (not shown) as is well known in the art. The action of the articulating apparatus is illustrated in phantom. An inking plate 704 is etched with a pattern 706 corresponding to the configuration of the layers to be printed. Conductive medium, such as conductive ink, is applied to pattern 706. Resilient pad 702 is brought into contact with plate 704 and the conductive medium is transferred from pattern 706 to pad 702. Pad 702 is then aligned to and brought into contact with a substrate 708. The conductive medium is transferred from pad 702 to substrate 708, and pad 702 is lifted away from substrate 708. Preferably substrate 708 is a continuous sheet of material, such as Kapton tape, which is later separated into individual circuit assemblies. After the conductive medium is transferred substrate 708, substrate may be passed through a curing oven 701, if necessary, to fast dry the conductive medium. It is expected that apparatus 700 will form a portion of a comprehensive manufacturing process including circuit chip placement automation and other related processing to produce completed radio frequency identification tags in accordance with the present invention.

In summary, and with reference to FIG. 1 and FIG. 12, a circuit assembly includes a substrate formed to include a conductive trace and a circuit chip secured to the substrate. The circuit chip includes a conductive pad, and a layer of conductive medium is printed on the substrate and coupling the conductive pad to the conductive trace. In additional preferred embodiments, the substrate may also include a circuit chip recess with the circuit chip being secured to the substrate within the recess.

Referring to FIG. 3 and FIG. 9, a radio frequency identification tag includes a substrate formed to include a conductive trace. A radio frequency identification tag circuit chip is secured to the substrate, and the radio frequency identification tag circuit chip includes a conductive pad. A layer of conductive medium is printed on the substrate and couples the conductive pad to the conductive trace. Alternatively, a radio frequency identification tag includes a substrate, a radio frequency identification tag circuit chip secured to the substrate and an antenna secured to the substrate. The radio frequency identification tag circuit chip has a first conductive pad and a second conductive pad, and the antenna has a first antenna lead and a second antenna lead. A first layer of conductive medium is printed on the substrate coupling the first conductive pad to the first antenna lead and a second layer of conductive medium is printed on the substrate coupling the second conductive pad to the second antenna lead.

In another alternative embodiment of the present invention, and with reference to FIG. 4, a radio frequency identification tag includes a substrate having plurality of conductive traces formed on a surface and a template secured to the surface. The template includes a circuit chip recess, and a radio frequency identification tag circuit chip is disposed within the recess and secured to the surface. The radio frequency identification tag circuit chip includes a conductive pad, and a layer of conductive medium is printed on the template coupling the conductive pad to at least one of the plurality of conductive traces.

The present invention overcomes the thickness limitations posed by either of flip chip technology or wire loop bonding technology. The present invention permits, and at substantially reduced cost, coupling of radio frequency identification tag circuit chips to thin substrates formed to include printed conductive traces.

The present invention advantageously avoids costly flip chip technology and the associated process handling difficulties in permitting circuit chips to be secured to the substrates conductive pads up.

The present invention further provides a cost effective, processing efficient alternative to wire loop bonding technology and its associated wire loop bond height and rigid substrate material limitations.

Many additional changes and modifications could be made to the invention without departing from the fair scope and spirit thereof. The scope of some changes is discussed above. The scope of others will become apparent from the appended claims.

We claim:

1. A radio frequency identification tag comprising:
   a substrate, the substrate formed to include a conductive trace;
   a radio frequency identification tag circuit chip secured to the substrate, the radio frequency identification tag circuit chip including a conductive pad; and
   a layer of conductive medium printed on the substrate and coupling the conductive pad to the conductive trace.

2. The radio frequency identification tag of claim 1, further comprising an antenna secured to the substrate, and layer of conductive medium printed on the substrate coupling the antenna to the conductive trace.

3. The radio frequency identification tag of claim 2, the layer comprising a first layer and a second layer of conductive medium.

4. The radio frequency identification tag of claim 2, the antenna comprising a coil antenna.

5. The radio frequency identification tag of claim 2, the antenna comprising conductive ink printed on the substrate.

6. The radio frequency identification tag of claim 1, the conductive trace comprising conductive ink printed on the substrate.

7. The radio frequency identification tag of claim 1, further comprising a circuit component secured to the substrate, the circuit component including a circuit component conductive pad, and a third layer of conductive medium printed on the substrate coupling the circuit component conductive pad to the conductive trace.

8. The radio frequency identification tag of claim 1, the substrate comprising a recess and the radio frequency identification tag circuit chip disposed within the recess.

9. The radio frequency identification tag of claim 1, comprising an insulating layer disposed adjacent an edge of the radio frequency identification tag circuit chip.

10. The radio frequency identification tag of claim 1, wherein the radio frequency identification tag comprises one of an inductive coupled device and a capacitive coupled device.

11. A radio frequency identification tag comprising:
    a substrate;
    a radio frequency identification tag circuit chip secured to the substrate, the radio frequency identification tag circuit chip including a first conductive pad and a second conductive pad;
    an antenna secured to the substrate, the antenna having a first antenna lead and a second antenna lead; and
    a first layer of conductive medium printed on the substrate and coupling the first conductive pad to the first antenna lead and a second layer of conductive medium printed on the substrate and coupling the second conductive pad to the second antenna lead.

12. The radio frequency identification tag of claim 11, comprising a circuit component secured to the substrate, the circuit component comprising a first component conductive pad and a second component conductive pad, the first layer coupling the first component conductive pad to the first conductive pad and the first antenna lead and the second layer coupling the second component conductive pad to the second conductive pad and the second antenna lead.

13. The radio frequency identification tag of claim 11, the antenna comprising a coil antenna.

14. The radio frequency identification tag of claim 11, the antenna comprising conductive ink printed on the substrate.

15. The radio frequency identification tag of claim 11, the substrate comprising a recess and the radio frequency identification tag circuit chip disposed within the recess.

16. The radio frequency identification tag of claim 11, comprising an insulating layer disposed adjacent an edge of the radio frequency identification tag circuit chip.

17. The radio frequency identification tag of claim 11, wherein the radio frequency identification tag comprises one of an inductive coupled device and a capacitive coupled device.

18. A radio frequency identification tag comprising:
    a substrate having plurality of conductive traces formed on a surface;
    a template secured to the surface, the template including a recess;
    a radio frequency identification tag circuit chip disposed within the recess and secured to the surface, the radio frequency identification tag circuit chip including a conductive pad; and
    a layer of conductive medium printed on the template and coupling the conductive pad to at least one of the plurality of conductive traces.

19. The radio frequency identification tag of claim 18, further comprising an antenna secured to the substrate, the antenna having an antenna lead, the template comprising an antenna lead recess, the antenna lead disposed within the antenna lead recess and the layer coupling the antenna lead to the conductive pad.

20. The radio frequency identification tag of claim 19, the antenna comprising a coil antenna.

21. The radio frequency identification tag of claim 19, further comprising a circuit component, the circuit component having a circuit component conductive pad, the template comprising a circuit component recess, the circuit component disposed within the circuit component recess and secured to the substrate, and the layer coupling the circuit component conductive pad to the conductive pad and the antenna lead.

22. The radio frequency identification tag of claim 18, comprising an insulating layer disposed adjacent an edge of the radio frequency identification tag circuit chip.

23. The radio frequency identification tag of claim 18, wherein the radio frequency identification tag comprises one of an inductive coupled device and a capacitive coupled device.

24. A circuit assembly comprising:
 a substrate, the substrate formed to include a conductive trace;
 a circuit chip secured to the substrate, the circuit chip including a conductive pad; and
 a layer of conductive medium printed on the substrate and coupling the conductive pad to the conductive trace.

25. The circuit assembly of claim 24, the conductive trace comprising conductive ink printed on the substrate.

26. The circuit assembly of claim 24, further comprising a second circuit chip secured to the substrate, the second circuit chip including a second conductive pad, and the circuit assembly comprising a second layer of conductive medium printed on the substrate coupling the second conductive pad to the conductive trace.

27. The circuit assembly of claim 24, the substrate comprising a recess and the circuit chip disposed within the recess.

28. The circuit assembly of claim 24, comprising an insulating layer disposed adjacent an edge of the circuit chip.

29. A circuit assembly comprising:
 a substrate including a conductive trace formed on a surface;
 a template secured to the substrate, the template comprising a recess;
 a circuit chip disposed within the recess and secured to the substrate, the circuit chip including a conductive pad; and
 a layer of conductive medium printed on the template and coupling the conductive pad to the conductive trace.

30. The circuit assembly of claim 29, further comprising a second circuit chip, the second circuit chip having a second conductive pad, the template comprising a second recess, the second circuit chip disposed within the second recess and secured to the substrate, and the layer coupling the second conductive pad to the conductive pad.

31. The circuit assembly of claim 29, comprising an insulating layer disposed adjacent an edge of the circuit chip.

32. The circuit assembly of claim 31, the insulating layer disposed within the recess.

33. A circuit assembly comprising:
 a substrate,
 a first circuit chip secured the substrate;
 a second circuit chip secured to the substrate; and
 a layer of conductive medium electrically coupling the first circuit chip and the second circuit chip, the layer printed on the substrate over the first circuit chip and under the second circuit chip.

34. The circuit assembly of claim 33, comprising a second layer coupling the first circuit chip and the second circuit chip, the second layer printed on the substrate and over the first circuit chip and the second circuit chip.

* * * * *